United States Patent
Møller

(10) Patent No.: US 6,690,250 B2
(45) Date of Patent: Feb. 10, 2004

(54) RFI FILTER FOR A FREQUENCY CONVERTER

(75) Inventor: Henry Møller, Nordborg (DK)

(73) Assignee: Danfoss Drives A/S, Grasten (DK)

( * ) Notice: Subject to any disclaimer, the term of this patent is extended or adjusted under 35 U.S.C. 154(b) by 0 days.

(21) Appl. No.: 09/995,116

(22) Filed: Nov. 27, 2001

(65) Prior Publication Data

US 2002/0070821 A1 Jun. 13, 2002

(30) Foreign Application Priority Data

Dec. 7, 2000 (DK) ........................................ 2000 01837

(51) Int. Cl.[7] .................................................. H03H 7/01
(52) U.S. Cl. .......................... 333/181; 333/12; 333/172; 363/39
(58) Field of Search ............................ 363/39, 47, 48, 363/53; 333/12, 172, 181, 17.2; 323/901, 908

(56) References Cited

U.S. PATENT DOCUMENTS

| 5,570,277 A | * | 10/1996 | Ito et al. .................... 363/53 X |
| 5,646,498 A | * | 7/1997 | Lipo et al. .................. 363/40 X |
| 5,930,130 A | * | 7/1999 | Katyl et al. .................... 363/53 |
| 6,094,036 A | * | 7/2000 | Rampold ................... 363/50 X |

FOREIGN PATENT DOCUMENTS

| EP | 0 930 695 A2 | 12/1998 | ............ H02M/1/12 |
| EP | 01168588 A1 | * | 1/2002 | ............ H02M/7/48 |
| JP | 02155477 | | 6/1990 | ............ H02M/7/48 |
| WO | WO 200041293 A1 | * | 7/2000 | ............ H02M/1/12 |

OTHER PUBLICATIONS

DS/EN 55011—"Industrial, scientific and medical (ISM) radio–frequency equipment Radio disturbance characteristics—Limits and methods of measurement", CENELEC, European Committee for Electrotechnical Standardization, 1998.

* cited by examiner

Primary Examiner—Robert Pascal
Assistant Examiner—Kimberly E Glenn
(74) Attorney, Agent, or Firm—McCormick, Paulding & Huber LLP

(57) ABSTRACT

The invention relates to an RFI filter used for avoidance of mains retro-action in the form of radio noise. RFI filters are connected to frequency converters in order to reduce radio noise transmitted via conductors. These filters comprise large noise-decoupling capacitors which are connected to earth, and during start up of the frequency converter the capacitors cause leakage currents to earth. This gives rise to problems in those circumstances, where a circuit breaker is connected to a frequency converter and an RFI filter, because the leakage current is higher than the trigger current for the circuit breaker. The solution to this problem is to place a resistor in series with the noise-decoupling capacitor and parallel with the resistor to place a switch, which can be opened or closed with a control signal from a controller. The invention also concerns a method for activation of an RFI filter.

12 Claims, 2 Drawing Sheets

RFI FILTER FOR A FREQUENCY CONVERTER

FIELD OF THE INVENTION

The invention relates to and RFI filter and to a method of activating an RFI filter which is connected to a frequency converter.

BACKGROUND OF THE INVENTION

In frequency converters for speed regulation of electric motors pulse width and pulse amplitude modulation is extensively used when controlling power semiconductors. This modulation has as an unwanted side effect, the generation of conductor transmitted radio noise. EN 55011 describes limit values for transmission of radio noise (Radio Frequency Interference) for units which generate electrical noise. The noise is typically located in the area of some kHz up till about 30 MHz. In order to observe these limits, building in or adding an RFI filter can be done. When designing an RFI filter for a frequency converter it must be taken into account whether the rectifier is controlled or uncontrolled, and also the switching frequency of the inverter must be considered. Further, the length of the motor cables is an essential design parameter. RFI filters can be connected on the output of the frequency converter as well as being placed in the intermediate circuit or on the mains side. This invention concerns RFI filters on the mains side and in the intermediate circuit.

However, the use of RFI filters causes problems if at the same time a fault current circuit breaker is connected to the mains side of the frequency converter. Heavy duty RFI filters have one or more earthed (PE, Protective Earth) capacitors which are so big that the circuit breaker is activated during start up. This problem can be solved by using circuit breakers with a higher trip current or by using circuit breakers with delay circuits so that pulses having a short duration will not cause triggering.

Alternatively the problem with unwanted triggering of the circuit breaker can be solved in designing the RFI filter in a way that reduces the earth leakage current. From EP 0 930 695 an RFI filter is known which makes it possible to connect a frequency converter to a circuit breaker. The three-phased filter comprises in each phase two coils, and between each coil a capacitor is connected to a common capacitor star point. From this star point a parallel connection of a resistor and a capacitor leads to earth.

The disadvantage with the circuit described is the use of relatively large and thus expensive coils. The capacitor C2 limits the earth leakage current but at the same time reduces the performance of the RFI filter. To compensate for this reduction the filter performance has been increased by placing two coils in each phase and it must be assumed, that these coils also have a relatively large inductivity. This large inductivity together with the capacitors leads to a large resonant overvoltage across C2, and in order to limit this overvoltage a resistor R2 is permanently placed parallel to C2.

Further, the circuit will not be applicable to high sensitivity circuit breakers without increasing the size of the coils further.

The RFI filter designer faces another problem, namely the use of symmetrically and non-symmetrically earthed main supplies. In symmetrically earthed mains supplies the star point of the three phases is earthed which to a high degree is the case in Europe. Asymmetrical mains supplies are often used in the United States where one of the three phases is earthed, a so-called delta-earthed mains supply. Frequency converters on asymmetrical mains supplies can cause considerable earth leakage currents, which will more often trigger a circuit breaker than is the case when frequency converters are connected to symmetrical mains supplies. It has been empirically determined that the connection of a frequency converter on asymmetrically earthed mains supplies happens in about 10% of the cases. Based on the above the object of the present invention is to develop a simple RFI filter which can prevent triggering of ordinary (FI interrupters) or high sensitivity earth leakage circuit breakers during start up of a load, especially a frequency converter.

Another object of the present invention is to develop an RFI filter which can be used on ordinary earthed mains supplies as well as on asymmetrically earthed mains supplies.

SUMMARY OF THE INVENTION

By using an RFI filter which is connected to a voltage source on the one side and a to a noise generating circuit on the other side, and where the filter seen from the direction of the voltage source comprises a coil connected in series with the supply conductor, and where a branch from the supply conductor incorporates an earthed series connection consisting of a noise-decoupling capacitor and a resistor, the objects of the present invention are met by connecting a switch in parallel to the resistor. The switch can be opened and closed by means of a control signal from a controller.

The advantage with this solution is, that the RFI filter can be used on ordinary earthed mains supplies as well as on asymmetrically earthed mains supplies. On asymmetrically earthed mains supplies the switch is kept open during start up as well as during operation, whereas the switch on ordinary mains supplies preferably is closed during operation. It is, therefore, not necessary for the manufacturer to have two versions of the RFI filter. Instead, the RFI filter can be adapted to the mains supply at the end user.

When operating on ordinary earthed mains supplies it is advantageous to keep the switch open until the noise-decoupling capacitor has been fully charged and first then to short-circuit the resistor. In this way the noise-decoupling capacitor will be directly earthed during the normal time of operation—no series resistor is active—and hereby a reduction in the efficiency of the filter is avoided. The noise-decoupling capacitors and the resistor can thus be sized in a way, that the earth leakage current on activation is smaller than the trigger current for high sensitivity circuit breakers. In addition, the present invention has the added advantage that the size of the coil can be kept relatively small.

If the RFI filter is used on polyphased mains supplies—typically three-phased—the resistor can simply be connected to the star point of the noise-decoupling capacitors, and the switch connected in parallel from the star point to earth.

It is especially advantageous if the resistor together with the relay and a further capacitor form a parallel connection between the star point of the noise-decoupling capacitors and earth. In this way the additional capacitor during operation on asymmetrically earthed mains supplies improves the filter performance.

The filter according to the invention can also be used in d.c. circuits such as the intermediate circuit of a frequency converter. In connecting the noise-decoupling capacitor to the positive- or negative side of the intermediate circuit the circuit breaker can be protected against unwanted triggering.

If the noise-decoupling capacitor is connected midway between two series connected capacitors, which are placed between the positive and the negative bus bars of the intermediate circuit, the noise-decoupling capacitor can be protected against high voltage. This means that a lower rated and thus inexpensive component can be employed.

To enable the use of the RFI filter also on asymmetrically earthed mains supplies a capacitor is connected in the intermediate circuit, where one pole is connected to the positive or the negative bus bar and the second pole is connected to earth.

In order to obtain the optimum attenuation of radio noise transmitted by cable, the RFI filter according to the invention should be placed on the mains side as well as in the intermediate circuit. This gives a two-section filter. It is particularly advantageous if the switches are activated at the same time by the same controller.

Preferably, the described switches are relays, however, transistors can also be used.

The filter is particularly applicable in a frequency converter for speed control of a motor where a circuit breaker is placed on the mains side of the frequency converter.

Further, the invention relates to a method for activating an RFI filter which is connected to a frequency converter, where the RFI filter comprises an earthed series connection and where the series connection comprises a noise-decoupling capacitor in series with a resistor. In particular it is advantageous if a switch is placed in parallel across the resistor and kept open until the noise-decoupling capacitor is essentially fully charged, whereafter the switch is closed via a control signal from a controller thus bypassing the resistor. This method prevents unwanted activation of the earth leakage circuit breaker during start up.

In using two RFI filters placed respectively on the mains side and in the intermediate circuit of the frequency converter, and in using one controller to close the switches simultaneously in the two filters, the circuit is simplified and the total attenuation of the noise is increased.

DETAILED DESCRIPTION OF THE PREFERRED EMBODIMENT

Figure 1:
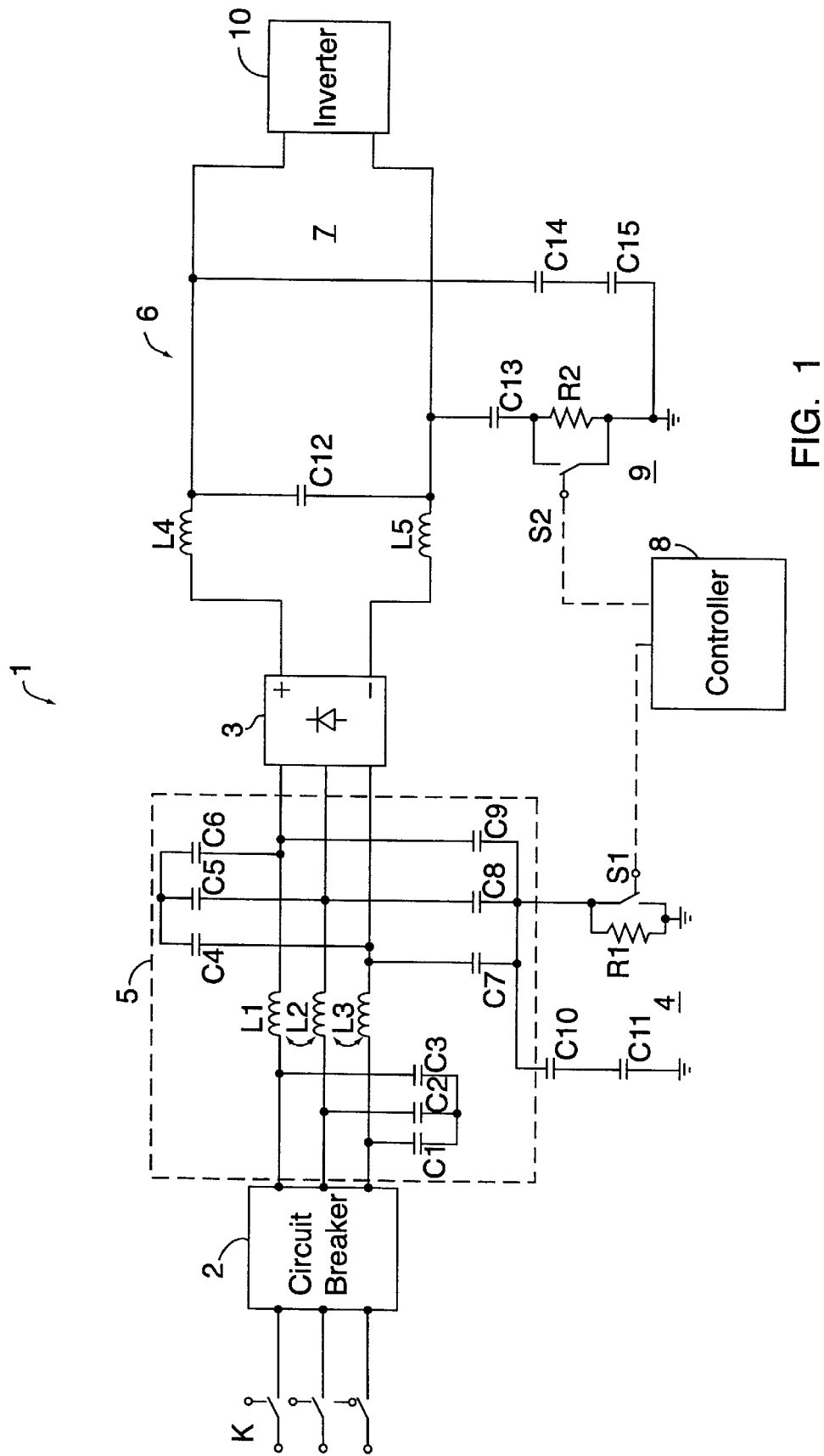
FIG. 1 schematically illustrates a first embodiment of the invention.

As shown in FIG. 1, the mains section and the input section of a frequency converter are generally designated by the reference number 1. On the mains side a voltage source (not shown) is connected to the switches K, which in turn are connected to a circuit breaker 2 through which three phases are led to the input of the frequency converter. The capacitors C1, C2 and C3 are connected to the phase conductors at one pole and at the other pole they are connected in a common star point. In a known manner they function to suppress differential noise. This also applies to the capacitors C4, C5 and C6. Between the two sets of capacitors each phase has inserted a coil (L1, L2 and L3) which acts as common mode coils. These three coils are wound on a ferrite core. Branched from the supply conductors are capacitors C7, C8 and C9 which function as noise-decoupling capacitors and are also connected in a common star point. Each set of coils L and capacitors C form an LC noise suppressing filter. Emerging from the star point of the capacitors is a parallel connection of the resistor R1, the relay S1 and the series connection C10 and C11. C10 and C11 can also be replaced by a single capacitor, however, on asymmetrically earthed mains supplies where S1 must be kept open, high voltages can occur in the midpoint which exceeds the voltage rating of the single capacitor. This parallel circuit, generally referred to by the reference number 4, is earthed. By means of the box 5 those components are marked, which during ordinary operation act as a passive RFI filter on symmetrically earthed mains supplies. In this embodiment the rectifier 3 is non-controlled, but a controlled rectifier is also applicable. Following the rectifier 3 which converts the alternating current into a pulsating direct current that is led to the intermediate d.c. circuit 6, follows the coil L4. Its primary task is to suppress the $5^{th}$, $7^{th}$ and the $9^{th}$ harmonic of the current during operation in order to avoid mains retro-action, however, it also reduces the radio noise. This coil is therefore coupled with L5 in the negative bus bar of the d.c. bus. As regards noise, L4 and L5 can be considered a parallel connection because the intermediate circuit capacitor C12 can be considered a short-circuit to high-frequency radio noise. C12 is followed by a further radio noise-reducing circuit comprising S2, R2 and C13 as well as C14 and C15. An inverter generally designated by reference numeral 10, is connected to the output 7. A controller 8 determines whether the switches S1 and S2 are to be closed which should not take place at asymmetrically mains supplies. Information about which type of mains supply the frequency converter, the RFI-filter and the circuit breaker are connected to, is entered by the operator via the control panel of the frequency converter to the controller 8. Alternatively, the operator can place a jumper at the relay, where the jummper determines whether the relay is to be closed or not. If the relays S1 and S2 are set to be controllable, the opening and closing timings are determined by the controller 8.

When the switches K at the input of the circuit breaker are closed, the in-rush sequence begins. Due to their size the capacitors C7, C8 and C9 will sink a large current. If their star point had been directly connected to earth, this current would suffice to trigger the circuit breaker. An ordinary FI-interrupter breaks at about 0.5 A whereas a high sensitivity FI interrupter breaks already at 30 mA. However, the star point is connected to the parallel circuit 4, and the capacitors C10 and C11 are chosen so small in proportion to C7, C8 and C9 that they are acting strongly limiting on the amplitude of the leakage current and the duration of the current pulse. As an example C10 and C11 have the size 220 nF whereas C7, C8 and C9 are 1 $\mu$F. One further task of the resistor R1 (100 kOhm) is to equalize the potential in the star point before the relay S1 makes. During starting, the peak-voltage across S1 will be between 200 and 500V, but C10 and C11 are discharged through R1 so that the voltage across R1 will finally be very close to 0V and thus not damage S1. During the starting phase the switch S1 is open, whereby the parallel circuit of C10, C11 and R1 functions as an in-rush protection. The controller 8 that was activated almost at the same time as the switches K were closed, has registered the time since starting up, and after a predetermined time the switch in the relay S1 is closed. The switches are hereafter closed during the remaining operation time of the frequency converter, so that the real RFI capacitors C7, C8 and C9 are directly earthed and the optimum filter performance is reached. To save energy for keeping the relay contacts closed, the relay S1 can be a bistable relay.

The protection against triggering of the circuit breaker due to earth leakage current can be extended to cover the intermediate circuit of the frequency converter, see FIG. 1 with the parallel circuit 9. The mode of operation is as follows: When the switches K at the input of the circuit breaker are closed, the in-rush of the intermediate circuit in relation to ground starts. Due to its size the capacitor C13 will sink a large current. If it had been directly connected to earth, this current would be sufficient to trigger the circuit breaker. However, C13 is series connected with the parallel connection of R2 and S2, where R2 during start up acts as an ohmic choke. Here too, the purpose of the resistor R2 (100 kOhm) is to equalize the potential before the switch S2 is closed. During the start up phase the switch S2 is open so that R2 can act as an inrush limiter. The controller 8 has registered the time since start up, and after a time that essentially corresponds to the charging time of the capacitor C13, the switch on relay S2 is closed. The switches are now closed during the remaining operation period, so that the real RFI capacitor C13 is directly earthed and the optimum filter performance is reached. Resistor R2 and relay S2 can of course change places with capacitor C13. To save energy for keeping the contacts closed, the switch S2 can be placed in the same relay as the switch S1.

Thus the negative bus bar is decoupled through the RFI capacitor C13. The positive bus bar is decoupled through the two capacitors C14 and C15 which unlike C13 are permanently active. C14 and C15 are considerably smaller than C13 (220 nF in proportion to 1 $\mu$F) so the decoupling from the positive bus bar is smaller. Alternatively, a parallel circuit like 9 could also be inserted in series with C14 and C15, but practice has shown, that this circuit is dispensable. The purpose in coupling C14 and C15 from the positive bus bar directly to earth is to enable operation also at asymmetrically earthed main connections where the switch S2 is to be kept open.

The RFI filter used in the frequency converter thus comprises two sections, a first section of $2^{nd}$ order on the mains side and a second section of $2^{nd}$ order in the intermediate circuit. The resulting filter is thus of $4^{th}$ order.

During normal operation, the components in box 5 act as an RFI filter as is already known, and the parallel circuit 4 as well as the parallel circuit 9 in the intermediate circuit mainly act as in-rush filters during the start up phase. The RFI filters on the mains side and in the intermediate circuit can be described as exhibiting two working characteristics, the first working characteristic having a small RFI attenuation effect while the relay is open, whereas the RFI filter follows the other working characteristic, that is better attenuating, when the relay is closed. The total noise attenuation during starting is about 40 dB whereas it is 60 dB during normal operation. Thus, the RFI filters will only attain full efficiency on the second working characteristic, but it is of less importance as there will be no essential radio noise before the inverter begins to work.

Figure 2:
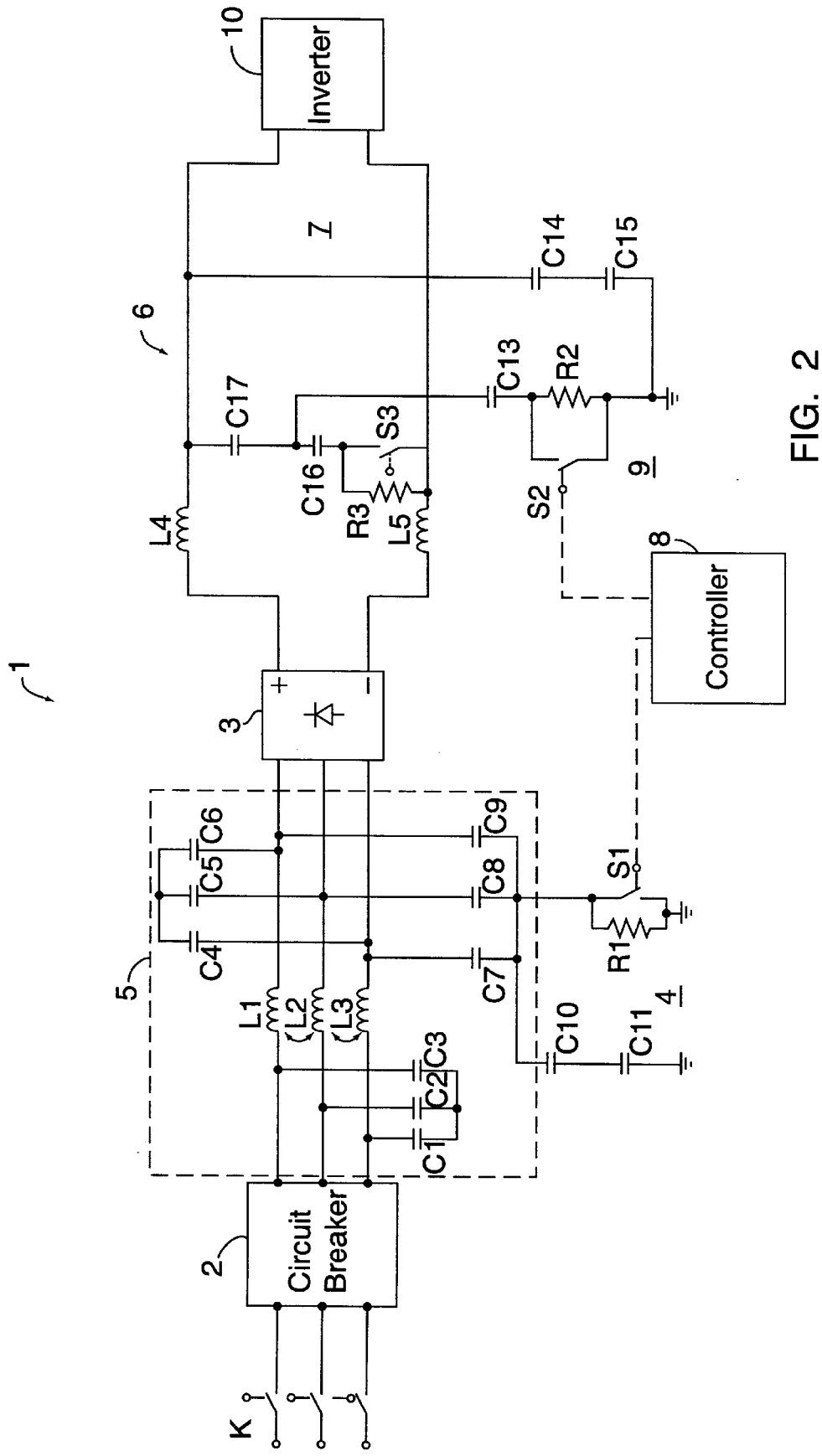
FIG. 2 schematically illustrates a second embodiment of the invention.

FIG. 2 shows a second embodiment of the invention. The intermediate circuit capacitor is now split up into two series connected capacitors C16 and C17 and the RFI capacitor C13 is connected to their common midpoint. As to the voltage potential, the midpoint is approximately at earth potential, and the advantage with this design is that the capacitor C13 is exposed to a lower voltage than in the first embodiment. This means, that a capacitor with a lower component rating can be used. The parallel connection of S3 and R3 is, in spite of structural resemblances, not part of the invention, as this is a known circuit (see for example JP 02155477), which serves another purpose than that of the invention, namely to protect the rectifier and the intermediate circuit capacitors C16 and C17 against high amperage during start up. During starting up S3 is open, but the switch will close when the capacitors have been charged.

The invention is described with a relay used as a switch, but a transistor switch would also be applicable. However, a relay is preferred, as the transistor in the ON-phase has a residual resistance, which during operation would reduce the RFI attenuating performance.

What is claimed is:

1. A filter for avoiding mains retro-action in the form of electrical noise transmitted via a supply conductor, comprising the supply conductor being connected on one end to a voltage source and on another end to an electronic circuit which generates the electrical noise; the filter in the direction from the voltage source incorporating a coil inserted serially in the supply conductor, and, branching from the supply conductor, an earthed serial connection including a noise-decoupling capacitor and a resistor, and wherein a switch is connected in parallel to the resistor, the switch being movable between an open and closed position in response to a control signal issued from a controller.

2. A filter according to claim 1, wherein the switch is maintained in the open position until the noise-decoupling capacitor is approximately fully charged, after which the switch in response to signals issued from the controller is moved to the closed position thereby short-circuiting the resistor and earthing the noise-decoupling capacitor.

3. A filter according to claim 2, wherein a first side of the switch is connected to earth and a second side of the switch is connected to a star point for at least two noise-decoupling capacitors, each of which is connected to a supply conductor.

4. A filter according to claim 3, wherein the resistor and the switch form a parallel circuit with at least one capacitor.

5. A filter according to claim 2, wherein the supply conductor includes one of a positive and negative bus bar of a d.c. intermediate circuit and the noise-decoupling capacitor is connected to on of the positive and negative bus bars.

6. A filter according to claim 2, wherein the noise-decoupling capacitor is connected approximately midway between two serially connected capacitors connected to a positive and a negative bus bar of a d.c. intermediate circuit.

7. A filter according to claim 5, further comprising a capacitor connected between earth and the one of the positive and negative bus bars of the d.c. intermediate circuit.

8. A filter according to claim 1, wherein the switch is one of a relay and a transistor.

9. A filter according to claim 1, wherein the filter is placed in a frequency converter and a circuit breaker is placed on the mains side of the frequency converter.

10. A method of activating at least one RFI filter which is connected to a frequency converter, where the at least one RFI filter comprises a serial connection connected to earth and where the serial connection comprises a noise-decoupling capacitor in series with a resistor, the method including the steps of: connecting a switch in parallel across the resistor and maintaining the switch in an open position until the noise-reducing capacitor is approximately fully charged, and closing the switch in response to signals generated by a controller, thereby short circuiting the resistor.

11. A method according claim 10, wherein a first and second RFI filter are activated, the first RFI filter being placed on the mains side of the frequency converter, and the second filter being placed in a d.c. intermediate circuit of the frequency converter, the method further including the step of simultaneously closing the respective switches in each of the first and second RFI filters.

12. A frequency converter for controlling an electric motor comprising:
- a first filter placed on a mains side of the frequency converter,
- a second filter placed in a d.c. intermediate circuit of the frequency converter, and
- a controller communicating with the first and second filters,
- each filter comprising a supply conductor having a coil inserted serially therein, and, branching from the supply conductor, an earthed serial connection including a noise-decoupling capacitor and a resistor, and wherein a switch is connected in parallel to the resistor, the switch being movable between an open and closed position in response to a control signal issued from the controller, and wherein the controller simultaneously closes the switches of the first and second filters.

* * * * *

UNITED STATES PATENT AND TRADEMARK OFFICE
CERTIFICATE OF CORRECTION

PATENT NO. : 6,690,250 B2
DATED : February 10, 2004
INVENTOR(S) : Henry Møller

It is certified that error appears in the above-identified patent and that said Letters Patent is hereby corrected as shown below:

Column 6,
Line 39, please replace "on" with -- one --.

Signed and Sealed this

Eighth Day of June, 2004

JON W. DUDAS
*Acting Director of the United States Patent and Trademark Office*